(12) United States Patent
Grass et al.

(10) Patent No.: US 9,337,045 B2
(45) Date of Patent: May 10, 2016

(54) METHODS OF FORMING A SEMICONDUCTOR CIRCUIT ELEMENT AND SEMICONDUCTOR CIRCUIT ELEMENT

(71) Applicant: GLOBALFOUNDRIES Inc., Grand Cayman (KY)

(72) Inventors: Carsten Grass, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 9 days.

(21) Appl. No.: 14/458,718

(22) Filed: Aug. 13, 2014

(65) Prior Publication Data
US 2016/0049302 A1    Feb. 18, 2016

(51) Int. Cl.
| H01L 21/02 | (2006.01) |
| H01L 21/28 | (2006.01) |
| H01L 29/51 | (2006.01) |
| H01L 21/8238 | (2006.01) |
| H01L 27/092 | (2006.01) |

(52) U.S. Cl.
CPC .. *H01L 21/28194* (2013.01); *H01L 21/823857* (2013.01); *H01L 27/092* (2013.01); *H01L 29/51* (2013.01)

(58) Field of Classification Search
CPC ........................... H01L 27/11502; H01L 28/55

USPC ....................................... 257/295, 369; 438/3
See application file for complete search history.

(56) References Cited

U.S. PATENT DOCUMENTS

| 6,452,229 B1* | 9/2002 | Krivokapic ....... H01L 29/42384 257/330 |
| 2005/0112854 A1* | 5/2005 | Ito ................... H01L 21/823892 438/527 |
| 2005/0205938 A1* | 9/2005 | Yagishita ............ H01L 27/1203 257/369 |
| 2007/0004049 A1* | 1/2007 | Nasu ..................... H01L 29/495 438/3 |

* cited by examiner

*Primary Examiner* — Jami M Valentine
(74) *Attorney, Agent, or Firm* — Amerson Law Firm, PLLC

(57) ABSTRACT

The present disclosure provides a method of forming a semiconductor circuit element and a semiconductor circuit element, wherein the semiconductor circuit element is formed on the basis of a replacement gate process replacing a dummy gate structure of a semiconductor device of the semiconductor circuit element by a gate oxide structure and a gate electrode material, wherein the gate oxide structure comprises a high-k material that is in the ferroelectric phase. In some illustrative embodiments herein, a semiconductor device is provided, the semiconductor device having a gate structure disposed over an active region of a semiconductor substrate. Herein, the gate structure comprises a spacer structure and a dummy gate structure which is replaced by a gate oxide structure and a gate electrode material, wherein the gate oxide structure comprises a ferroelectric high-k material.

18 Claims, 6 Drawing Sheets

METHODS OF FORMING A SEMICONDUCTOR CIRCUIT ELEMENT AND SEMICONDUCTOR CIRCUIT ELEMENT

BACKGROUND OF THE INVENTION

1. Field of the Invention

The present disclosure relates to a method of forming a semiconductor circuit element and to a semiconductor circuit element, and, more particularly, to forming a semiconductor circuit element in a gate-last process.

2. Description of the Related Art

In modern electronic equipment, integrated circuits (ICs) experience a vast applicability in a continuously spreading range of applications. Particularly, the demand for increasing mobility of electronic devices at high performance and low energy consumption drives developments to more and more compact devices having features with sizes ranging even into the deep submicron regime; the more so as current semiconductor technologies are apt of producing structures with dimensions in the magnitude of 10 nm. With ICs representing a set of electronic circuit elements integrated on a semiconductor material, normally silicon, ICs can be made much smaller than discreet circuits composed of independent circuit components. The majority of present-day ICs are implemented by using a plurality of circuit elements, such as field effect transistors (FETs), also called metal oxide semiconductor field effect transistors (MOSFETs or simply MOS transistors), and passive elements, such as resistors and capacitors, integrated on a semiconductor substrate with a given surface area. Typically, present day integrated circuits involve millions of single circuit elements formed on a semiconductor substrate.

The basic function of a MOSFET is that of an electronic switching element, wherein a current through a channel region between two contact regions, referred to as source and drain, is controlled by a gate electrode to which a voltage relative to source and drain is applied. Particularly, in applying a voltage exceeding a characteristic voltage level to the gate electrode, the conductivity state of a MOSFET is changed and the characteristic voltage level, usually called "threshold voltage" and in the following referred to as Vt, characterizes the switching behavior of a MOSFET. In general, Vt depends nontrivially on the transistor's properties, e.g., materials, dimensions etc., such that the implementation of a desired Vt involves plural steps of adjustment and fine-tuning during the fabrication process.

Currently, the most common digital integrated circuits built today use CMOS logic, which is fast and offers a high circuit density and low power per gate. CMOS or "complementary symmetry metal oxide semiconductor," as it is sometimes referred to, makes use of complementary and symmetrical pairs of P-type and N-type MOSFETs for implementing logic functions. Two important characteristics of CMOS devices are the high noise immunity and low static power consumption of a CMOS device because the series combination of complementary MOSFETs in a CMOS device draws significant power only momentarily during switching between on- and off-states, since one transistor of a CMOS device is always in the off-state. Consequently, CMOS devices do not produce as much waste heat as other forms of logic, for example, transistor-transistor logic (TTL) or NMOS logic, which normally have some standing current even when not changing state. In current CMOS technologies, standard transistors and IO devices have the same high-k dielectric and metal electrode, whereas, in comparison with standard devices, the $SiO_2$ oxide of IO devices is thicker.

In efforts to improve memory arrays, ferroelectric gate field effect transistors (FeFETs) have been recently in the focus of research. In general, ferroelectrics are dielectric crystals which show a spontaneous electric polarization, similar to ferromagnetic materials showing a spontaneous magnetization. Upon applying an appropriate external electric field to a ferroelectric material, the direction of polarization may be reoriented. The basic idea is to use the direction of spontaneous polarization in ferroelectric memories for storing digital bits. In FeFETs, the effect that one makes use of is the possibility to adjust the polarization state of a ferroelectric material on the basis of appropriate electrical fields which are applied to the ferroelectric material which, in a FeFET, is usually the gate oxide. Since the polarization state of a ferroelectric material is preserved unless it is exposed to a high, with regard to the polarization state, counter-oriented electrical field or a high temperature, it is possible to "program" a capacitor formed of ferroelectric material such that an induced polarization state reflects an information unit. Therefore, an induced polarization state is preserved, even upon removing an accordingly "programmed" device from a power supply. In this way, FeFETs allow the implementation of non-volatile electrically-switchable data storage devices.

Though a FeFET or a ferroelectric capacitor represent, in theory, very promising concepts for complex semiconductor devices, it is a difficult task to identify appropriate ferroelectric materials which are compatible with existing advanced manufacturing processes of complex devices, particularly at very small scales. For example, commonly-known ferroelectric materials, such as PZT or perovskites, are not compatible with standard CMOS processes. Hafnium (Hf) materials which are used in current fabrication technologies exhibit a paraelectric behavior due to the predominantly monoclinic crystal structure of $HfO_2$. However, recent research results indicate that hafnium oxide-based dielectric materials may represent promising candidates for materials with ferroelectric behavior to be used in the fabrication of ferroelectric semiconductor devices of ICs because recent results suggest that the monoclinic structure is suppressed in Zr, Si, Y and Al-doped hafnium oxide materials and stabilized crystal structures of ferroelectric nature were obtained in accordingly-doped samples.

In view of the above-described situation, it is, therefore, desirable to integrate a full functional FeFET device into a CMOS technology based on replacement metal gate processes.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides a method of forming a semiconductor circuit element and a semiconductor circuit element, wherein the semiconductor circuit element is formed on the basis of a replacement gate process replacing a dummy gate structure of a semiconductor device of the semiconductor circuit element by a gate oxide structure and a gate electrode material, wherein the gate oxide structure comprises a ferroelectric high-k material.

In a first aspect of the present disclosure, a method of forming a semiconductor circuit element is provided. In some illustrative embodiments herein, the method includes providing a first semiconductor device having a first gate structure disposed over a first active region which is provided within a semiconductor substrate, the first gate structure comprising a first spacer structure and a dummy gate structure, and replacing the dummy gate structure by a first gate oxide structure and a first gate electrode material, wherein the first gate oxide structure comprises a ferroelectric high-k material.

In a second aspect of the disclosure, a method of forming a semiconductor circuit element is provided. In illustrative embodiments herein, the method includes providing a first semiconductor device having a first gate structure disposed over a first active region which is provided within a semiconductor substrate, the first gate structure comprising a first spacer structure in the dummy gate structure, providing a second semiconductor device having a second gate structure disposed over a second active region adjacent the first active region, wherein the second gate structure comprises a dummy gate electrode material, a spacer structure and a first gate oxide structure which comprises a TiN layer disposed on a high-k material, forming a first masking pattern for covering the second semiconductor device and exposing the first semiconductor device, replacing the dummy gate structure by a first gate electrode material and a second gate oxide structure, wherein the second gate oxide structure comprises a ferroelectric high-k material different from the high-k material of the second semiconductor device, removing the first masking pattern, forming a second masking pattern for covering the first semiconductor device and exposing the second semiconductor device, and replacing the dummy gate electrode material by a second gate electrode material.

In a third aspect of the present disclosure, a semiconductor circuit element is provided. In illustrative embodiments herein, the semiconductor circuit element includes a first semiconductor device having a first gate structure disposed over a first active region which is provided within a semiconductor substrate, the first gate structure having a first gate oxide material, and a second semiconductor device having a second gate structure disposed over a second active region adjacent the first active region, wherein the second gate structure has a second gate oxide structure with a high-k material, wherein the first gate oxide material comprises a ferroelectric high-k material different from the high-k material of the second gate oxide structure.

BRIEF DESCRIPTION OF THE DRAWINGS

The disclosure may be understood by reference to the following description taken in conjunction with the accompanying drawings, in which like reference numerals identify like elements, and in which.

Figure 1:
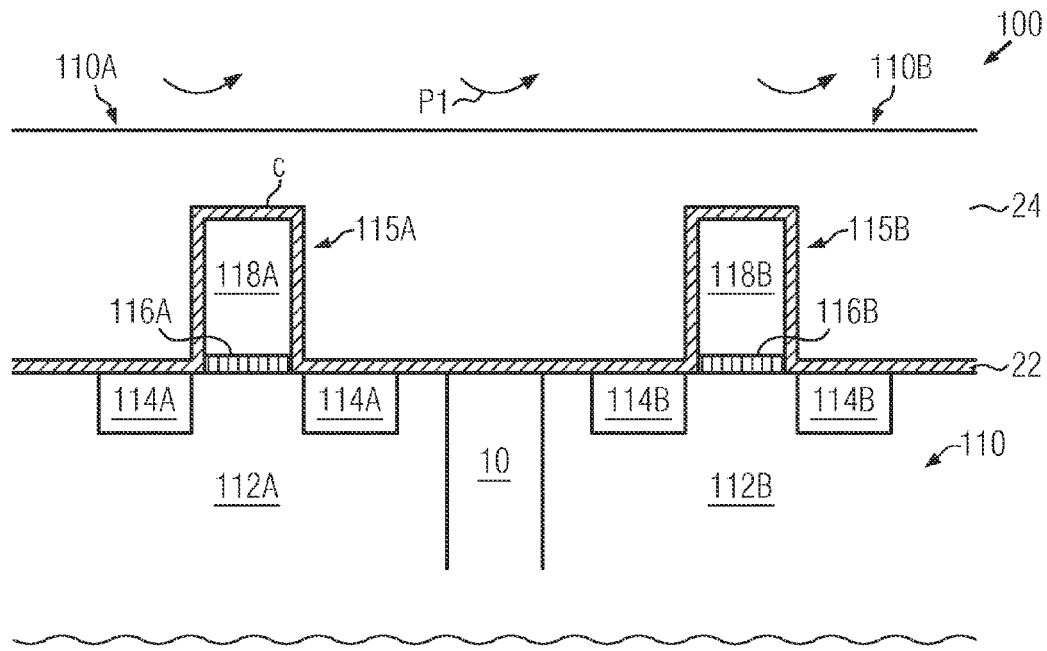
FIGS. 1-11 schematically show a replacement process in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor circuit elements comprising semiconductor devices that are integrated on or in a chip, such as FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor circuit elements of the present disclosure, and particularly semiconductor devices as illustrated by means of some illustrative embodiments, concern elements and devices which are fabricated by using advanced technologies. Semiconductor circuit elements of the present disclosure are fabricated by technologies applied to approach technology nodes smaller than 100 nm, for example smaller than 50 nm or smaller than 35 nm. The person skilled in the art will appreciate that the present disclosure suggests semiconductor circuit elements having structures with minimal length and/or width dimensions smaller than 100 nm, for example smaller than 50 nm or smaller than 35 nm.

The person skilled in the art understands that semiconductor devices may be fabricated as MOS devices, such as P-channel MOS transistors or PMOS transistors and N-channel transistors or NMOS transistors, and both may be fabricated with or without mobility-enhancing stressor features or strain-inducing features. A circuit designer can mix and match device types, using PMOS and NMOS devices, stressed and unstressed, to take advantage of the best characteristics of each device type as they best suit the semiconductor circuit element being designed.

In aspects of the present disclosure, a method of forming a semiconductor circuit element is provided. Herein, a first semiconductor device comprises a first gate structure which is disposed over a first active region of a semiconductor substrate. The first gate structure comprises a first spacer structure and a dummy gate structure. The first spacer structure may be formed by one or more spacers, such as one or more sidewall spacers covering sidewalls of the dummy gate structure, and one or more cap layers formed on an upper surface of the dummy gate structure. In accordance with illustrative embodiments of the present disclosure, the dummy gate structure comprises one of a polysilicon material layer and an amorphous silicon material layer. The polysilicon material layer or the amorphous silicon material layer may, for example, represent a dummy gate electrode or a replacement gate electrode as a sacrificial gate electrode material which is removed after high temperature annealing cycles for activating source/drain implants and forming silicide contact regions. The dummy gate structure may further comprise a dummy insulating material layer formed of at least one of a TiN material and a high-k dielectric material, the dummy insulating material layer being completely removed upon the removal of the dummy gate structure.

In some illustrative embodiments of the present disclosure, replacing the dummy gate structure may comprise removing the dummy gate structure for forming a gate trench in the first gate structure and depositing the ferroelectric high-k material over the first semiconductor device and in the gate trench. Herein, the gate trench is formed upon removing the dummy gate structure relative to the spacer structure, which remains in the first active region and delineates the gate trench.

In some illustrative embodiments of the present disclosure, the semiconductor circuit element may further comprise a second semiconductor device provided in a second active region adjacent to the first active region, the second semiconductor device comprising a second gate structure with a dummy gate electrode material, a second spacer structure and a second gate oxide structure. The second spacer structure may be formed in accordance with the first spacer structure and comprise at least one sidewall spacer covering the sidewalls of the second gate structure and at least one cap layer formed on an upper surface of the second gate structure. The dummy gate electrode material may be, for example, formed by polysilicon or amorphous silicon.

In some illustrative embodiments, the second gate oxide structure may comprise a TiN layer disposed on a high-k material different from the ferroelectric high-k material of the first semiconductor device. The high-k material of the second semiconductor device is different from the ferroelectric high-k material of the first semiconductor device and, particularly, the high-k material of the second semiconductor device is not ferroelectric. In some illustrative embodiments, the high-k material of the second semiconductor device may be a dielectric material on the basis of hafnium oxide and may be deposited early on prior to the formation of the sacrificial dummy gate electrode material.

In some illustrative embodiments of the present disclosure, the first and second semiconductor devices may form a semiconductor circuit element implementing a CMOS structure, wherein the first semiconductor device and the second semiconductor device are of complementary conductivity types. For example, the first semiconductor device may be implemented as a PMOS device, while the second semiconductor device is implemented as an NMOS device. Alternatively, the first semiconductor device may be implemented as an NMOS device, while the second semiconductor device is implemented as a PMOS device.

In the following, semiconductor circuit elements and methods of forming semiconductor circuit elements in accordance with various exemplary embodiments of the present disclosure are illustrated and described with regard to the figures. The described process steps, procedures and materials are to be considered only as exemplary embodiments designed to illustrate to one of ordinary skill in the art methods for practicing the invention. However, it is to be understood that the invention is not exclusively limited to the illustrated and described exemplary embodiments, as many possible modifications and changes exist which will become clear to the ordinary person skilled in the art when studying the present detailed description together with the accompanying drawings and the above background and summary of the invention. Illustrated portions of semiconductor devices may include only a single element, although those skilled in the art will recognize that actual implementations of semiconductor devices may include a large number of such elements. Various steps in the manufacture of semiconductor devices are well known and so, in the interests of brevity, many conventional steps will only be mentioned briefly herein, or will be omitted entirely without providing the well-known process details.

FIG. 1 schematically shows, in a cross-sectional view, a portion of a semiconductor circuit element 100 at the end of front-end of line (FEOL) processing and in the beginning of middle-end of line (MEOL) processing. Particularly, the semiconductor circuit element 100 comprises a semiconductor device 110A and a semiconductor device 110B. Herein, the semiconductor device 110B corresponds to the first semiconductor device as described above and the semiconductor device 110A corresponds to the second semiconductor device as described above.

The semiconductor device 110A comprises a gate structure 115A disposed over an active region 112A provided within a semiconductor substrate 110. The semiconductor substrate may be, for example, a bulk substrate or represent an active layer of a silicon-on-insulator (SOI) substrate or silicon/germanium-on-insulator (SGOI) substrate. In general, the terms "substrate," "semiconductor substrate" or "semiconducting substrate" should be understood to cover all semiconductor materials and all forms of such semiconductor materials and no limitation to a special kind of substrate is intended.

The gate structure 115A comprises a spacer structure implemented in the illustration of FIG. 1 by an insulating layer 22 covering sidewalls and an upper surface of a dummy gate electrode material 118A disposed on a gate oxide structure 116A. The dummy gate electrode material 118A may be, for instance, polysilicon material or amorphous silicon. FIG. 1 depicts the gate oxide structure 116A in a very schematic way and the person skilled in the art will appreciate that the gate oxide structure 116A may be a stack of different layers, such as a TiN layer disposed on a high-k material for forming the gate oxide of the gate structure 115A. As illustrated in FIG. 1, source and drain regions 114A are disposed within the active region 112A at opposing sides of the gate structure 115A.

Adjacent to the active region 112A and separated therefrom by means of an STI region 10, there is formed an active region 112B within the semiconductor substrate 110. A gate structure 115B of the semiconductor device 110B is disposed over the active region 112B. The gate structure 115B comprises a spacer structure schematically illustrated by means of the insulating layer 22 which covers sidewalls of a dummy gate structure 118B disposed on an insulating material layer 116B. The dummy gate structure may, for example, be formed by a polysilicon material or amorphous silicon. The insulating material layer 116B may comprise at least one of a TiN material and a high-k dielectric material. Furthermore, source and drain regions 114B are disposed within the active region 112B at opposing sides of the gate structure 115B.

The spacer structures of the semiconductor device 110A and the semiconductor device 110B are in FIG. 1 only schematically illustrated by means of the insulating layer 22. However, this does not pose any limitation to the present disclosure and the person skilled in the art will appreciate that more than one sidewall spacer covering the sidewalls of the gate structures 115A, 115B may be provided. For example, the spacer structure may comprise a so-called "spacer zero" for adjusting the position of source/drain extension regions (not illustrated in the figures) relative to the gate structures 115A, 115B, and a so-called "spacer one" for adjusting the position of deep source/drain regions (not illustrated in the figures) relative to the gate structures 115A, 115B.

Although the source and drain regions 114A, 114B are only schematically illustrated, it is to be understood that deep source/drain regions and source/drain extension regions with optional halo regions may be present. For example, source/drain extension regions (and optionally halo regions) may be formed after formation of spacer zero and prior to the formation of spacer one. The deep source/drain regions are then implanted in accordance with spacer one. According techniques are well-known in the art of which the skilled person is aware.

After having provided the gate structures 115A, 115B and the source/drain regions 114A, 114B, a fill material layer 24 is deposited over the semiconductor devices 110A and 110B such that the gate structures 115A, 115B are embedded into and covered by the fill material layer 24. In some illustrative embodiments, the fill material layer 24 is provided by a fill oxide, such as silicon oxide, while the insulating layer 22 for encapsulation of the gate structures 115A, 115B is formed by a nitride material, such as silicon nitride. In some special exemplary embodiments of the present disclosure, the insulating layer 22 may be formed by a nitride material which is deposited by means of molecular layer deposition (MLD) techniques. In some illustrative embodiments of the present disclosure, the fill material layer 24 has a thickness of about 200 nm.

In some alternative embodiments of the present disclosure (not illustrated in the figures), a patterning process may be applied to the insulating layer 22 before implanting the source/drain regions 114A, 114B into the respective active regions 112A, 112B for forming a sidewall spacer (not illustrated) and exposing the surfaces of the active regions 112A, 112B. The patterning process may be, for example, an anisotropic etch process that shapes the insulating layer 22 to form the sidewall spacer (not illustrated) from the insulating layer 22. In addition to the sidewall spacer (not illustrated), a separate gate cap may be formed for covering an upper surface of the gate structure 115A, 115B.

In the fabrication phase illustrated in FIG. 1, a polishing process P1, such as a chemical mechanical polishing (CMP) process, is performed until caps C of the gate structures 115A, 115B are exposed, wherein the caps C are provided by the insulating layer 22 covering an upper surface of the dummy gate electrode material 118A, 118B. Alternatively, the caps C may be provided by separate gate caps formed in addition to the insulating layer 22.

Figure 2:
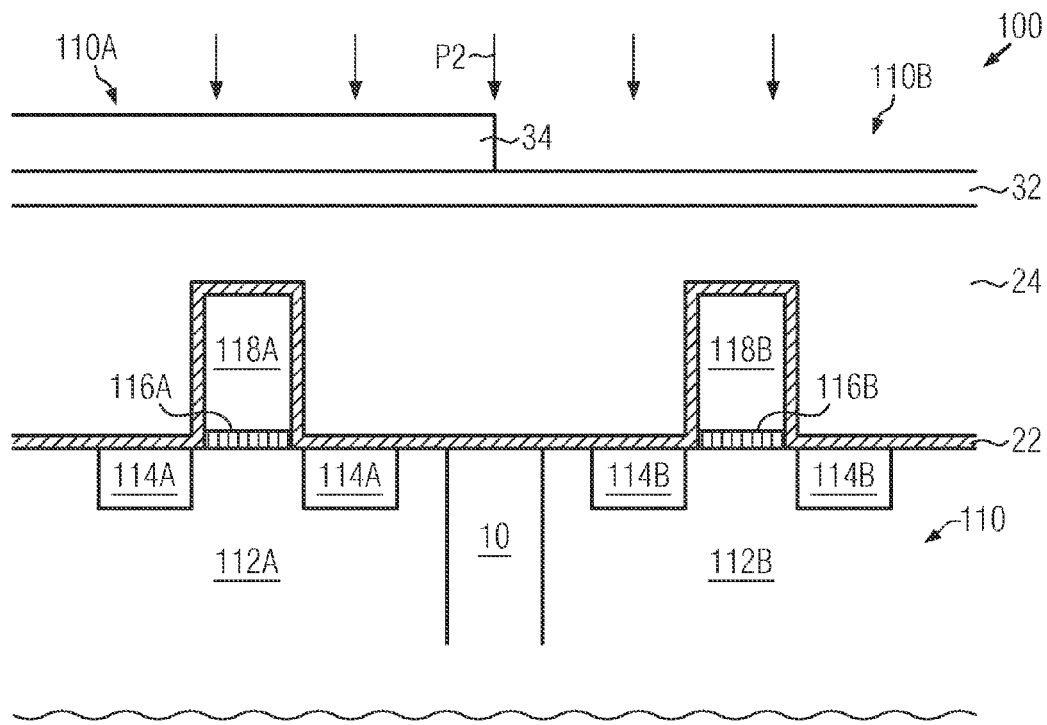

FIG. 2 schematically illustrates the semiconductor circuit element 100 at a subsequent phase during fabrication, wherein a hardmask layer 32 is deposited, such as an oxide or metal layer, e.g., TiN, and a patterned photoresist 34 is formed on the deposited hardmask layer 32. The patterned photoresist 34 is photolithographically patterned for covering the semiconductor device 110A and exposing the semiconductor device 110B. Subsequently to forming the patterned photoresist mask 34 on the hardmask layer 32, a patterning process P2 is performed to pattern the hardmask layer 32 in accordance with the photoresist mask 34.

Figure 3:
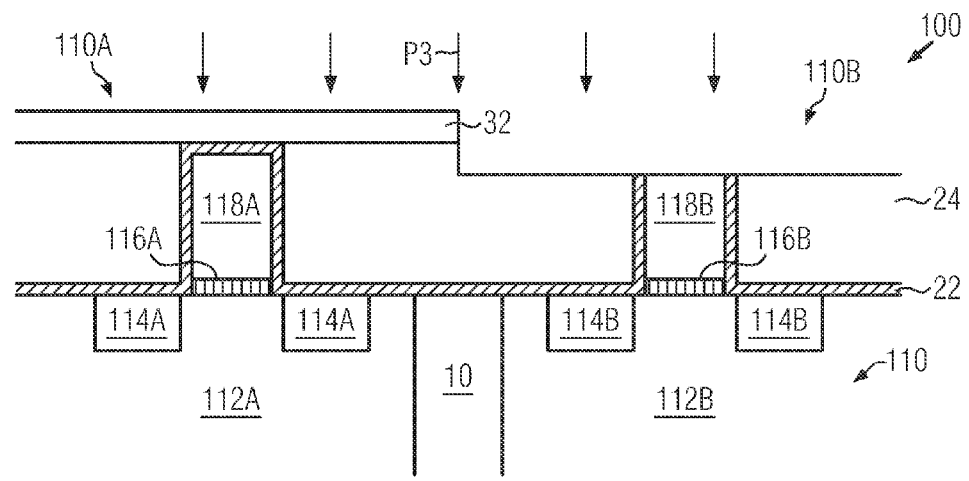

FIG. 3 schematically illustrates the semiconductor circuit element 100 at a subsequent phase during fabrication, wherein the hardmask 32 is patterned such that the semiconductor device 110A is covered by the patterned hardmask 32, while the semiconductor device 110B remains uncovered. Thus, the semiconductor device 110B is exposed to further processing as illustrated in FIG. 3.

In some illustrative embodiments, the patterning process P2 (FIG. 2) may, for example, comprise an unselective hardmask etching step, e.g., a reactive ion etching (RIE) process, for removing the exposed, i.e., uncovered, hardmask material layer 32 from above the semiconductor device 110B, followed by a resist strip step, e.g., on the basis of $NH_3$, for removing the patterned photoresist 34.

As illustrated in FIG. 3, after having opened the hardmask 32 for exposing the semiconductor device 110B and accordingly exposing the dummy gate electrode material 118B, a process P3 is performed for removing the dummy gate electrode material 118B. The process P3 may be a selective RIE process which removes the dummy gate electrode material 118B and stops on the insulating material layer 116B, particularly on the TiN material or the high-k dielectric material. Therefore, the insulating material layer 116B acts as an etch stop for the process P3.

Figure 4:
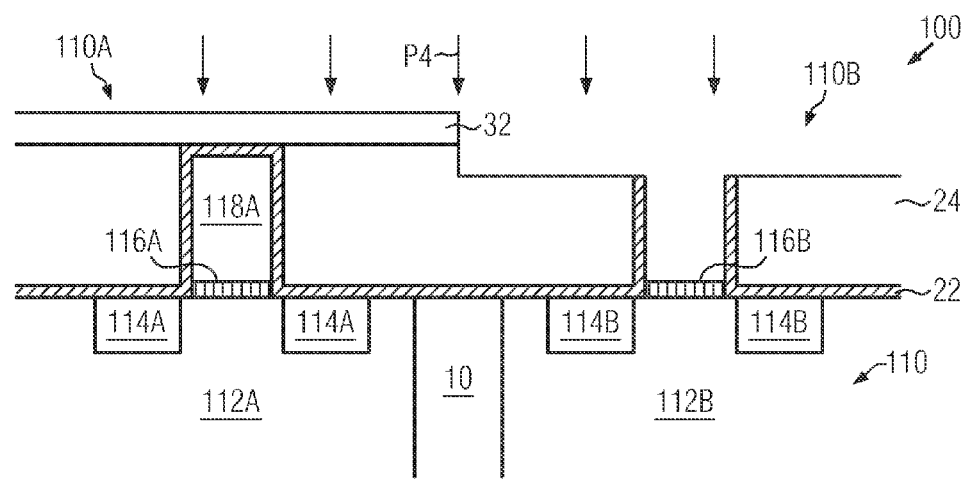

FIG. 4 schematically illustrates the semiconductor circuit element 100 at a phase during fabrication subsequent to the process P3 in FIG. 3. As illustrated in FIG. 4, the insulating material layer 116B is exposed to further processing as the dummy gate electrode material 118B is removed during the process P3. Next, a process P4 is performed for completely removing the insulating material layer 116B and for exposing the active region 112B. The process P4 may be a wet etch process for removing the remaining insulating material layer 116B, i.e., the remaining insulating material that is not removed in the process P3.

Figure 5:
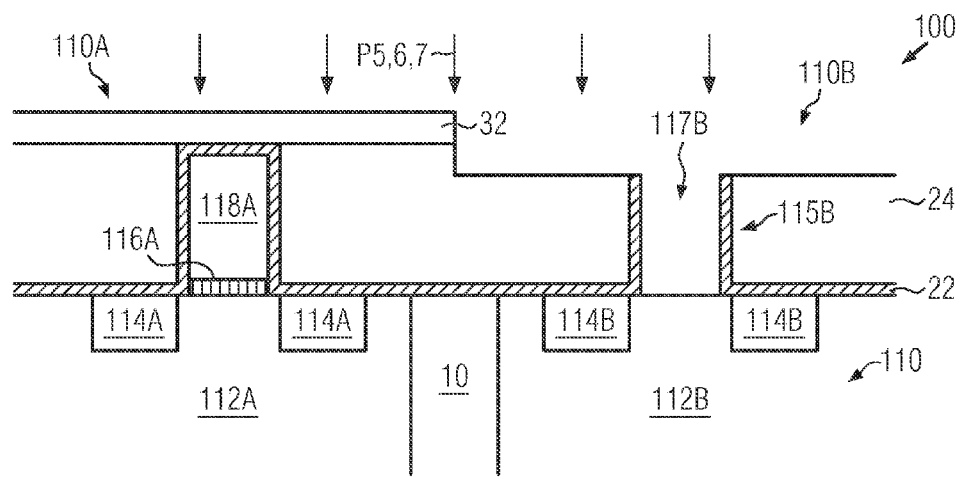

FIG. 5 illustrates the semiconductor circuit element 100 at a subsequent stage during fabrication after the process P4 is performed. As a result of the process P4, a gate trench 117B is formed in the gate structure 115B of the semiconductor device 110B. The gate trench 117B exposes a portion of the active region 112B to further processing.

Next, a sequence of processes P5, P6 and P7 is sequentially performed. In process P5, a ferroelectric high-k material 42 is deposited over the semiconductor device 110B and within the gate trench 117B. The deposited ferroelectric high-k material 42 may be in some illustrative embodiments deposited with a thickness in a range from about 5-25 nm or from about 10-20 nm by means of an atomic layer deposition (ALD) process. In some illustrative embodiments, the high-k material 42 deposited in the process P5 may be at least one of a thin film of doped hafnium oxide, such as $Y:HfO_2$ with an $YO_{1.5}$ content of 5.2 mol % (shows a ferroelectric hysteresis with remanent polarization Pr of 24 $\mu C/cm^2$), a thin film of $Si:HfO_2$ (shows a ferroelectric hysteresis with remanent polarization Pr of 10 $\mu C/cm^2$) with an $SiO_2$ content of 3.4 mol %, and a thin film of $ZrO_2$ doped hafnium oxide material at a mixture of more than 20 mol % $ZrO_2$ or more than 50 mol % $ZrO_2$ (shows a remanent polarization of 15 $\mu C/cm^2$ at 50 mol % $ZrO_2$). Alternatively, an undoped amorphous $HfO_2$ layer having a thickness of 10 nm or less, e.g., 6 nm, may be deposited during an ALD process, followed by an annealing step exposing the deposited undoped amorphous $HfO_2$ layer 42 to temperatures between 200° C. and 1100° C., such as 800° C. or less, e.g., in a range from about 200-400° C., preferably in a range from about 200-300° C., e.g., 250° C. or less.

In the subsequently performed process P6, a layer 44 of TiN material having a thickness from 5-20 nm, such as 5-10 nm, is deposited over the semiconductor device 110B and particularly over the ferroelectric high-k material layer 42 within the gate trench 117B. In the case of a ferroelectric high-k material layer 42 including pure HfO$_2$, the process P6 may comprise a physical vapor deposition (PVD) process having a deposition temperature of substantially less than or equal to about 400° C. Alternatively, the TiN layer 44 may be deposited by an ALD process to a thickness of 7 nm. Depending on the aspect ratio of the gate trench 117B, an optional third deposition process P7 may be performed to fill the gate trench with an aluminum fill, if the gate trench 117B is not completely filled after process P6 was performed.

In some illustrative embodiments of the present disclosure, the gate trench 117B may have a critical dimension (CD) of about 50 nm for SRAM cells in 28 nm technologies, for example, such that the gate trench 117B according to this example is by about 20 nm larger than nominal gate lengths in 28 nm technologies. In an explicit example where high-k material and metal gate electrode material is deposited in ALD processes, the deposited high-k material and the deposited metal gate electrode material may have a thickness of 20 nm or less such that the fill characteristics are advantageous, i.e., no deteriorating fill issues (such as voids, etc.) appear.

Figure 6:
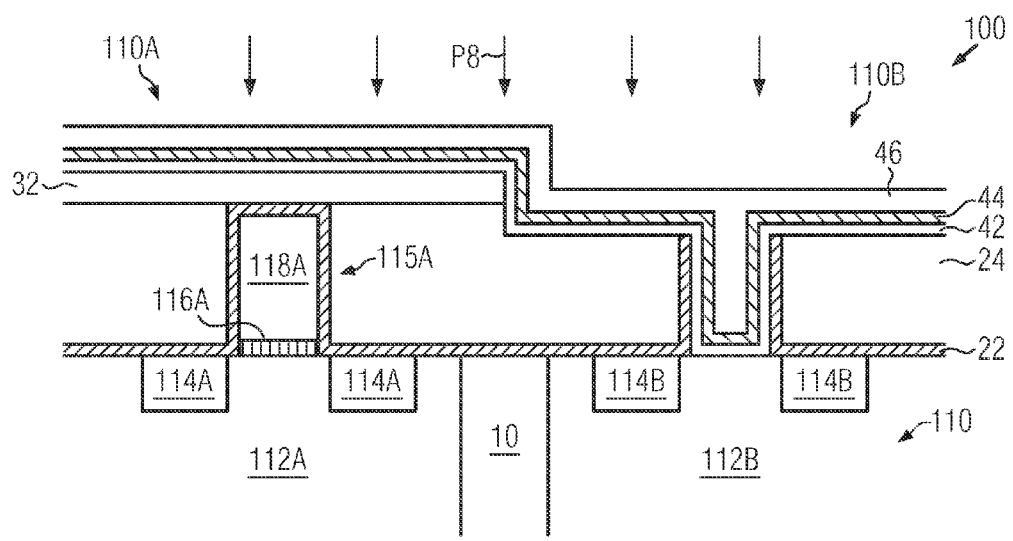

FIG. 6 schematically illustrates the semiconductor circuit element 100 at a phase during fabrication after the process sequences P5 to P7 (where P7 is optional, see above) is completed. As illustrated in FIG. 6, the gate trench 117B (FIG. 5) is filled by the layers 42 to 46 (where layer 46 is optional). Depending on the gate dimension and the aspect ratio of the gate trench 117B in FIG. 5, the layer 46 may be deposited with a thickness in the range of about 80-150 nm above the layer 44 outside the gate trench 117B.

Next, a polishing process P8 may be performed to polish the deposited layers 42-46 over the semiconductor circuit element 100 and particularly over the semiconductor device 110A until the gate structure 115A of the semiconductor device 110A is opened. In some illustrative embodiments, the process P8 is a CMP process.

Figure 7:
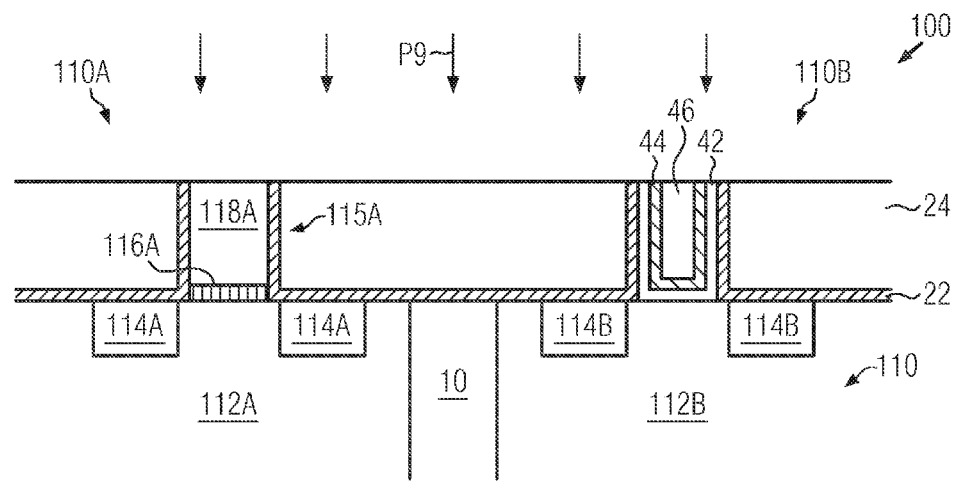

FIG. 7 schematically illustrates the semiconductor circuit element 100 at a phase during fabrication after the process P8 is completed. As illustrated in FIG. 7, the semiconductor device 110A and particularly the gate structure 115A is opened and the dummy gate electrode material 118A is exposed. Accordingly, the fill material layer 24 is exposed in the semiconductor devices 110A and 110B. The person skilled in the art appreciates that it may be advantageous for the process P8 to stop on the fill material layer 24 and to uniformly, but non-selectively, expose the dummy gate electrode material 118A in the semiconductor device 110A. Particularly, the dummy gate electrode material 118A is exposed by the CMP process step polishing the layer 46.

Next, a process P9 is performed, wherein a hardmask material layer 52 and a patterned photoresist 54 (see FIG. 8) are formed over the semiconductor circuit element 100. The patterned photoresist 54 is photolithographically patterned such that the semiconductor device 110B is covered by the photoresist 54, while the hardmask material layer 52 is removed from above the semiconductor device 110A. The person skilled in the art will appreciate that the hardmask material layer 52 is deposited such that the deposition temperature is equal to or smaller than 400° C. Accordingly, the ferroelectric nature of the ferroelectric high-k material layer 42 may be reliably preserved. The hardmask layer 52 may be an oxide or metal layer, such as TiN. The person skilled in the art will appreciate that, depending on the metal fill integration of the semiconductor device 110A, NMOS and PMOS devices may be processed separately.

Figure 8:
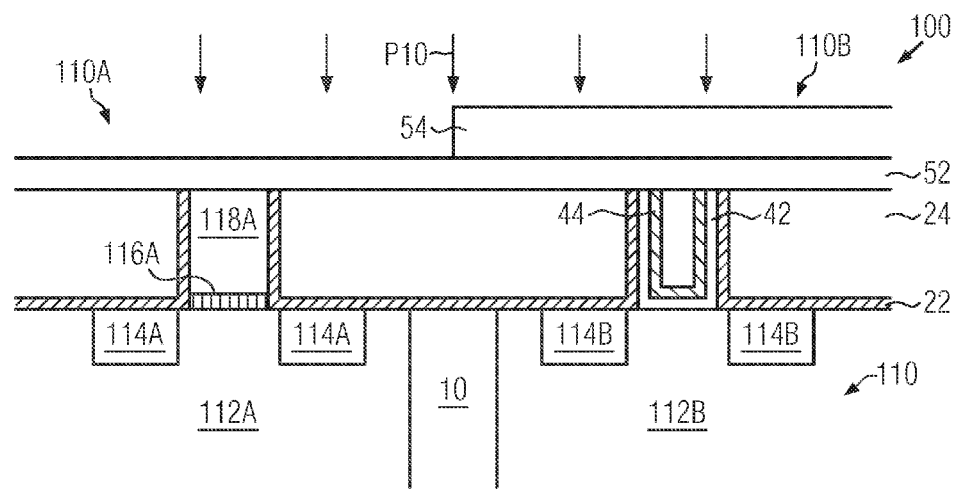

FIG. 8 schematically illustrates the semiconductor circuit element 100 after the above-described process P9 is completed. Next, a process P10 is performed to open the hardmask over the semiconductor device 110A such that the dummy gate electrode material 118A is exposed and, in a subsequent sub-step of process P10, the dummy gate electrode material 118A is removed to expose the gate oxide structure 116A. In some illustrative embodiments, the hardmask layer 52 is opened over the semiconductor device 110A by means of an unselective RIE step followed by a resist strip on the basis of NH$_3$. The dummy gate electrode material 118A is then removed by an appropriate RIE or wet etch step which is highly selective to TiN and the fill material of the fill material layer 24. The person skilled in the art will appreciate that the process P10 and particularly the sub-step for removing the dummy gate electrode material 118A is configured such that the removal of the dummy gate electrode material 118A stops on the TiN material of the gate oxide structure 116A and particularly the TiN material of the gate oxide structure 116A acts as an etch stop for the process P10.

Figure 9:
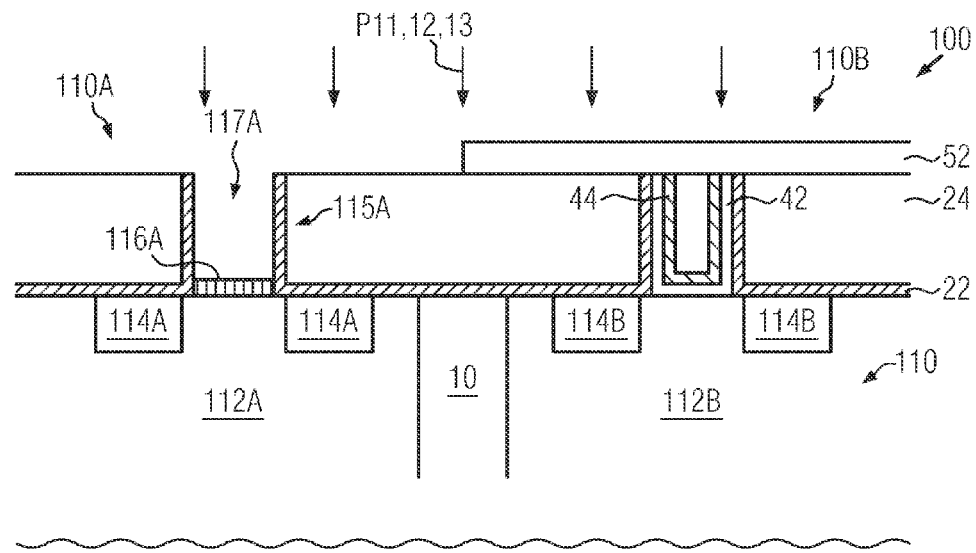

FIG. 9 schematically illustrates the semiconductor circuit element 100 after the process P10 is completed. Particularly, the dummy gate electrode material 118A is removed from the gate structure 115A of the semiconductor device 110A.

Next, a sequence of processes P11-P13 is performed for depositing the gate electrode structure of the semiconductor device 110A, i.e., a work function metal fill process P11 (e.g., ALD or PVD) and the deposition of the gate electrode, e.g., Ti (PVD in P12) and Al (PVD in P13) is performed, wherein P13 is optional, similar to P7 in FIG. 5 above.

Figure 10:
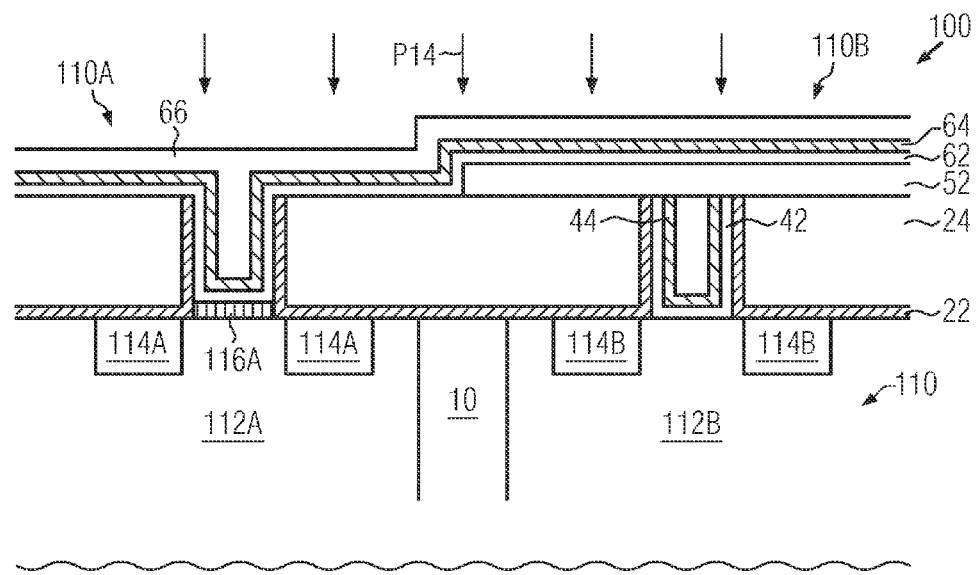

FIG. 10 schematically illustrates the semiconductor circuit element 100 after the sequence of processes P11-P13 is completed and a work function metal layer 62 is deposited over the semiconductor device 110A and within the gate trench 117A, followed by a Ti-comprising layer 64 disposed on the work function metal fill layer 62. An optionally remaining trench (depends on aspect ratio of the gate trench 117A) in the gate trench 117A is filled by aluminum material 66 in process P13.

The person skilled in the art will appreciate that for NMOS and PMOS structures, different metal materials and different integration schemes exist which may apply in the presently-described fabrication.

Figure 11:
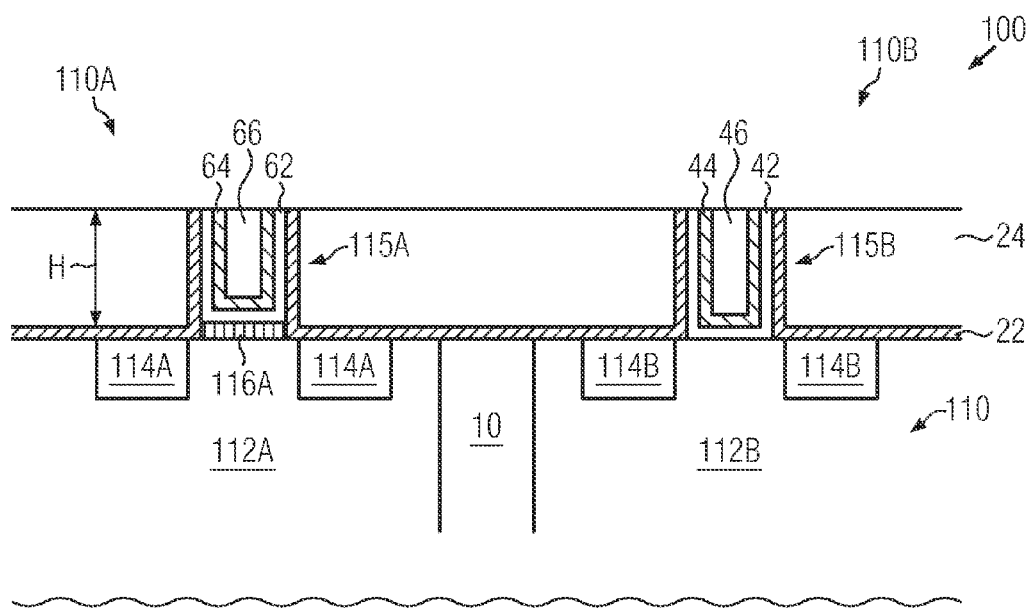

Next, a process P14 is performed for polishing the deposited material layers 62 to 66 over the semiconductor devices 110A and 110B and to define the final gate height for the gate structures 115A, 115B of the semiconductor devices 110A and 110B. FIG. 11 schematically illustrates the semiconductor circuit element 100 in a cross-sectional view, once the process P14 is completed and a final gate height H is adjusted. The person skilled in the art will appreciate that the gate structure 115B of the semiconductor device 110B comprises a ferroelectric high-k material 42 which extends on the channel region and along the sidewalls of the gate structure 115B. During the processing performed to the semiconductor device 110A, the ferroelectric high-k material layer 42 is reliably encapsulated by the TiN layer 44 and the hardmask 52 (FIGS. 8-10). Due to the low temperatures during the integration of the gate structure 115B of the semiconductor device 110B, the integrity of the gate oxide structure 116A of the semiconductor device 110A may be conserved.

The present disclosure provides for a hybrid gate-last or replacement gate process in which, for one semiconductor device (here semiconductor device 110A), a gate oxide structure is implemented at an early stage during fabrication (i.e., during FEOL processing), while the ferroelectric gate structure of another semiconductor device (here semiconductor device 110B) is integrated during MEOL processing, according to gate-last techniques. Therefore, a full and complex CMOS gate-last integration is avoided, while a ferroelectric gate oxide is included into known CMOS process flows according to the gate-last technique. The advantages of ferroelectric gate oxides with the advantages of the CMOS technique, such as improved device reliability and mobility at scaled EOT, are merged by the methods of forming a semiconductor circuit element as described in accordance with the present disclosure.

In some aspects, the present disclosure proposes to integrate full functional FeFET devices into advanced replacement metal gate CMOS technologies using hybrid GOX integration. It is, thus, possible to implement FeFET devices (e.g., semiconductor device 110B) in classical high-k CMOS technologies at the same time with logic devices (e.g., semiconductor device 110A) following a process flow with hybrid gate oxide. However, the person skilled in the art will appreciate that the present disclosure is not limited to hybrid replacement metal gate technologies. Particularly, the disclosure is also intended to comprise embodiments in which a full replacement metal gate integration is also performed with regard to the second semiconductor device. Herein, in addition to a first semiconductor device as described above, a second semiconductor device having a second gate structure may be provided, the second semiconductor device being disposed over a second active region which is disposed within a semiconductor substrate, wherein the second gate structure comprises a second spacer structure and a second dummy gate structure. In some illustrative embodiments herein, the second dummy gate structure is replaced by a second gate oxide structure and a second gate electrode material, after a first dummy gate structure of the first semiconductor device is replaced by a first gate oxide structure comprising a ferroelectric high-k material and a first gate electrode material. Alternatively, the replacement of the second dummy gate structure is performed prior to the replacement of the first dummy gate structure.

In summary, the present disclosure provides a method of forming a semiconductor circuit element and a semiconductor circuit element, wherein the semiconductor circuit element is formed on the basis of a replacement gate process replacing a dummy gate structure of a semiconductor device of the semiconductor circuit element by a gate oxide structure and a gate electrode material, wherein the gate oxide structure comprises a high-k material that is in the ferroelectric phase. In some illustrative embodiments herein, a semiconductor device is provided, the semiconductor device having a gate structure disposed over an active region of a semiconductor substrate. Herein, the gate structure comprises a spacer structure and a dummy gate structure which is replaced by a gate oxide structure and a gate electrode material, wherein the gate oxide structure comprises a ferroelectric high-k material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor circuit element, the method comprising:

providing a first semiconductor device having a first gate structure disposed over a first active region which is provided within a semiconductor substrate, said first gate structure comprising a first spacer structure and a first dummy gate structure;

providing a second semiconductor device having a second gate structure disposed over a second active region adjacent to said first active region, wherein said second gate structure comprises a second dummy gate electrode material, a second spacer structure and a second gate oxide structure which comprises a TiN layer disposed on a high-k material different from said ferroelectric high-k material;

after providing the second semiconductor device, replacing said first dummy gate structure by a first gate oxide structure and a first gate electrode material, wherein said first gate oxide structure comprises a ferroelectric high-k material; and after the replacement of said first dummy gate structure in said first semiconductor device, replacing said second dummy gate electrode material by a second gate electrode material.

2. The method of claim 1, wherein replacing said first dummy gate structure comprises removing said first dummy gate structure for forming a gate trench in said first gate structure and depositing said ferroelectric high-k material over said first semiconductor device and in said gate trench and on and in contact with a surface of the semiconductor substrate.

3. The method of claim 2, further comprising depositing a TiN layer on and in contact with said ferroelectric high-k material.

4. The method of claim 2, wherein said ferroelectric high-k material is deposited by performing an ALD process.

5. The method of claim 1, wherein said first dummy gate structure comprises an insulating material layer and a first dummy gate electrode material disposed on said insulating material layer, said insulating material layer comprising at least one of a TiN material and a high-k dielectric material.

6. The method of claim 5, wherein replacing said first dummy gate structure comprises performing one of a selective RIE process and a wet etch process with said insulating material layer as an etch stop and performing a further wet etch process to completely remove said insulating material layer.

7. The method of claim 1, wherein the replacement of said second dummy gate electrode material in said second semiconductor device comprises performing a selective etching process by using said second gate oxide structure as an etch stop.

8. The method of claim 7, further comprising, prior to the replacement of said first dummy gate structure in said first semiconductor device, forming a first masking pattern for covering said second semiconductor device during the replacement of said first dummy gate structure in said first semiconductor device.

9. The method of claim 8, further comprising, after the replacement of said first dummy gate structure in said first semiconductor device, forming a second masking pattern for covering said first semiconductor device during the replacement of said second dummy gate electrode material.

10. The method of claim 1, wherein said first semiconductor device is provided as one of a PMOS device and an NMOS device and said second semiconductor device is provided as an NMOS device when said first semiconductor device is provided as a PMOS device and said second semiconductor device is provided as a PMOS device when said first semiconductor device is provided as an NMOS device.

11. A method of forming a semiconductor circuit element, the method comprising:
  providing a first semiconductor device having a first gate structure disposed over a first active region which is provided within a semiconductor substrate, said first gate structure comprising a first spacer structure and a dummy gate structure;
  providing a second semiconductor device having a second gate structure disposed over a second active region adjacent said first active region, wherein said second gate structure comprises a dummy gate electrode material, a second spacer structure and a first gate oxide structure which comprises a TiN layer disposed on a high-k material;
  forming a first masking pattern for covering said second semiconductor device and exposing said first semiconductor device;
  replacing said dummy gate structure by a first gate electrode material and a second gate oxide structure, wherein said second gate oxide structure comprises a ferroelectric high-k material different from said high-k material of said second semiconductor device;
  removing said first masking pattern;
  forming a second masking pattern for covering said first semiconductor device and exposing said second semiconductor device; and
  replacing said dummy gate electrode material by a second gate electrode material.

12. The method of claim 11, wherein said first semiconductor device and said second semiconductor device form a CMOS device.

13. A method of forming a semiconductor circuit element, the method comprising:
  providing a first semiconductor device having a first gate structure disposed over a first active region which is provided within a semiconductor substrate, said first gate structure comprising a first spacer structure and a first dummy gate structure; and
  replacing said first dummy gate structure by a first gate oxide structure and a first gate electrode material, wherein said first gate oxide structure comprises a ferroelectric high-k material and wherein replacing said first dummy gate structure comprises removing said first dummy gate structure for forming a gate trench in said first gate structure and depositing said ferroelectric high-k material over said first semiconductor device and in said gate trench and on and in contact with a surface of the semiconductor substrate.

14. The method of claim 13, further comprising depositing a TiN layer on said ferroelectric high-k material.

15. A method of forming a semiconductor circuit element, the method comprising:
  providing a first semiconductor device having a first gate structure disposed over a first active region which is provided within a semiconductor substrate, said first gate structure comprising a first spacer structure and a first dummy gate structure; wherein said first dummy gate structure comprises an insulating material layer and a first dummy gate electrode material disposed on said insulating material layer, said insulating material layer comprising at least one of a TiN material and a high-k dielectric material, and
  replacing said first dummy gate structure by a first gate oxide structure and a first gate electrode material, wherein said first gate oxide structure comprises a ferroelectric high-k material.

16. The method of claim 15, wherein replacing said first dummy gate structure comprises removing said first dummy gate structure for forming a gate trench in said first gate structure and depositing said ferroelectric high-k material over said first semiconductor device and in said gate trench and on and in contact with a surface of the semiconductor substrate.

17. The method of claim 16, further comprising depositing a TiN layer on said ferroelectric high-k material.

18. The method of claim 15, wherein replacing said first dummy gate structure comprises performing one of a selective RIE process and a wet etch process with said insulating material layer as an etch stop and performing a further wet etch process to completely remove said insulating material layer.

* * * * *